(12) United States Patent
Iizuka

(10) Patent No.: US 9,462,730 B2
(45) Date of Patent: Oct. 4, 2016

(54) SHIELD MEMBER AND METHOD FOR MANUFACTURING THE SAME

(71) Applicant: YAZAKI CORPORATION, Minato-ku, Tokyo (JP)

(72) Inventor: Hayato Iizuka, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 14/835,772

(22) Filed: Aug. 26, 2015

(65) Prior Publication Data

US 2015/0373883 A1 Dec. 24, 2015

Related U.S. Application Data

(63) Continuation of application No. PCT/JP2014/054175, filed on Feb. 21, 2014.

(30) Foreign Application Priority Data

Feb. 28, 2013 (JP) .................. 2013-038416

(51) Int. Cl.
| | | |
|---|---|---|
| *H05K 9/00* | (2006.01) | |
| *H02G 3/06* | (2006.01) | |
| *H02G 3/04* | (2006.01) | |

(52) U.S. Cl.
CPC .......... *H05K 9/0009* (2013.01); *H02G 3/0675* (2013.01); *H05K 9/0018* (2013.01); *H05K 9/0049* (2013.01); *H02G 3/0487* (2013.01); *Y10T 29/49206* (2015.01)

(58) Field of Classification Search
CPC .................................................. H05K 9/0018
See application file for complete search history.

(56) References Cited

U.S. PATENT DOCUMENTS

| | | | | |
|---|---|---|---|---|
| 2001/0027040 A1* | 10/2001 | Yoshioka | ............... | H01R 4/646 439/98 |
| 2003/0062177 A1* | 4/2003 | Yagi | ....................... | H01R 9/032 174/359 |
| 2004/0011550 A1* | 1/2004 | Imai | ..................... | H01R 9/0518 174/74 R |
| 2005/0208798 A1* | 9/2005 | Shimoda | ............. | B60L 11/1803 439/98 |
| 2005/0266729 A1* | 12/2005 | Fukushima | ............ | H01R 9/032 439/607.46 |
| 2008/0164059 A1* | 7/2008 | Cipolla | ................ | H05K 9/0018 174/360 |
| 2009/0126987 A1* | 5/2009 | Gladd | .................. | H01R 13/658 174/393 |
| 2012/0028500 A1* | 2/2012 | Lee | ..................... | H01R 13/6593 439/607.01 |
| 2013/0087377 A1* | 4/2013 | Adachi | ................ | H01R 13/648 174/372 |
| 2013/0175080 A1* | 7/2013 | Colahan | .............. | H05K 9/0018 174/357 |
| 2013/0319720 A1* | 12/2013 | Aoyama | ............. | H05K 9/0018 174/68.3 |
| 2014/0138144 A1* | 5/2014 | Hamouz | .............. | H05K 9/0018 174/360 |
| 2016/0205815 A1* | 7/2016 | Mori | .................... | H05K 9/0018 174/360 |

FOREIGN PATENT DOCUMENTS

| | | |
|---|---|---|
| JP | H06-152177 A | 5/1994 |
| JP | 2001-298295 A | 10/2001 |
| JP | 2002-329557 A | 11/2002 |
| JP | 2006-302820 A | 11/2006 |
| JP | 2010-140875 A | 6/2010 |
| JP | 2012-164688 A | 8/2012 |

\* cited by examiner

*Primary Examiner* — Hung V Ngo

(74) *Attorney, Agent, or Firm* — Mots Law, PLLC

(57) ABSTRACT

A shield member (1) includes a flexible main body part (11) surrounding electrical wire connected to a device in a shield case; and a flange part (12) provided at a shield-case-side terminal part of the main body part (11) so as to be integral with the main body part (11), facing a wall surface of the shield case. The stiffness of the flange part (12) is higher than that of the main body part (11).

3 Claims, 6 Drawing Sheets

SHIELD MEMBER AND METHOD FOR MANUFACTURING THE SAME

CROSS REFERENCE TO RELATED APPLICATIONS

This application is a Continuation of PCT Application No. PCT/JP2014/054175, filed on Feb. 21, 2014, and claims the priority of Japanese Patent Application No. 2013-038416, filed on Feb. 28, 2013, the content of both of which is incorporated herein by reference.

BACKGROUND

1. Technical Field

The present invention relates to a shield member and a method for manufacturing the same.

2. Related Art

Conventionally, various suggestions have been made regarding a shield structure in which a shield member such as cylindrical braided wires woven in mesh is attached to a metal shield case to be mounted on an electric vehicle (EV), a hybrid electric vehicle (HEV) or the like. A first conventional example and a second conventional example (see JP 2002-329557 A) of this kind of the shield structure will be described with reference to FIGS. 5 and 6.

A shield structure 100 according to the first conventional example is, as shown in FIG. 5, a structure in which a terminal of a shield member 110 that collectively surrounds a plurality of electrical wires (not illustrated) is attached to a shield shell 120 with a crimping ring 130.

A shield structure 200 according to the second conventional example is, as shown in FIG. 6, a structure in which a terminal of a shield member 210 that collectively surrounds a plurality of electrical wires (not illustrated) is sandwiched by an inner shell 221 of a shield shell 220 and an outer shell 222.

According to the first conventional example and the second conventional example, the shield members 110 and 210 are connected electrically with the shield shells 120 and 220, respectively, so as to secure shieldability with respect to a shield case (not illustrated).

SUMMARY OF THE INVENTION

However, in the first conventional example and the second conventional example, before attaching each of the shield structures 100 and 200 to the shield case (not illustrated), the terminals of the shield members 110 and 210 are necessary to be attached to the shield shells 120 and 220, respectively.

At this time, the terminals of the shield members 110 and 210 were necessary to be processed (for example, to be widen) to conform to shapes of the shield members 110 and 210, respectively. Thereby, there was a problem that gaps of mesh braided wires and the like of the shield members 110 and 210 were varied (the gaps became uneven) so as to deteriorate the shieldability.

The present invention has been made to solve the above-described problem, and aims to provide a shield member, which can improve the shieldability and also can improve the attachability to the shield case, and a method for manufacturing the shield member.

A shield member according to a first aspect of the present invention include a flexible main body part surrounding an electrical wire connected to a device in a shield case, and a flange part provided at a shield-case-side terminal part of the main body part so as to be integral with the main body part, facing a wall surface of the shield case. The stiffness of the flange part is higher than the stiffness of the main body part.

The flange part may be formed at the shield-case-side terminal part of the main body part by widening and folding back into a plurality of layers.

The flange part may include a plurality of surfaces having a stepped shape. A method for manufacturing a shield member according to a second aspect of the present invention includes forming a flange part integrally with a main body part by processing, where the flange part is facing a wall surface of a shield case at a shield-case-side terminal part of the flexible main body part and the flexible main part is surrounding an electrical wire connected to a device in the shield case, wherein the stiffness of the flange part is formed to be higher than the stiffness of the main body part.

According to the shield member of the first aspect of the present invention, the flange part is provided at a shield-case-side terminal part of the main body part integrally with the main body part, and the stiffness of the flange part is higher than the stiffness of the main body part. Thereby, the shield member according to the first aspect of the present invention does not require a process for attaching the flange part as the shield shell to the terminal part of the main body part, so that the terminal part of the main body part 11 is not necessary to be processed. Consequently, unevenness of gaps of mesh braided wires of the shield member is not likely to be caused (the gaps become uniform), whereby the shieldability can be improved. Moreover, compared with the case where the shield member and the shield shell are individual, like in the conventional examples, the process for attaching the flange part as the shield shell to the terminal part of the main body part becomes unnecessary, and a shape of the flange part can be maintained. Thus, only the direct attachment of the flange part of the shield member to the shield case is necessary, so that the attachability to the shield case can be improved.

DETAILED DESCRIPTION

Figure 1:
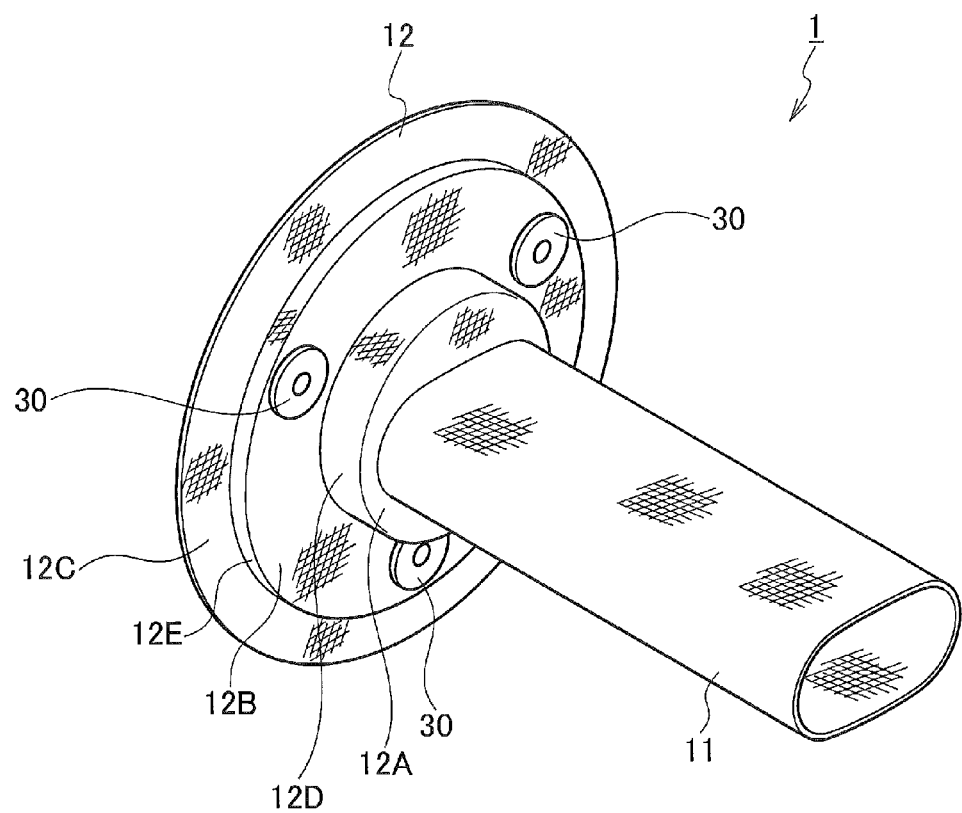
FIG. 1 is a perspective assembly view that illustrates a shield member according to an embodiment.

An embodiment of a shield member according to the present invention and a method for manufacturing the shield member will be described with reference to the drawings. Incidentally, in the following description about the drawings, the same or similar parts are denoted by the same or similar reference numerals. However, it should be noted that the drawings are just schematic, and ratios of the respective dimensions and the like are different from the real ones. Therefore, specific dimensions and the like should be judged in the light of the following description. In addition, the drawings may include the parts that are different from each other in dimensional relationship or ratio.

Figure 2:
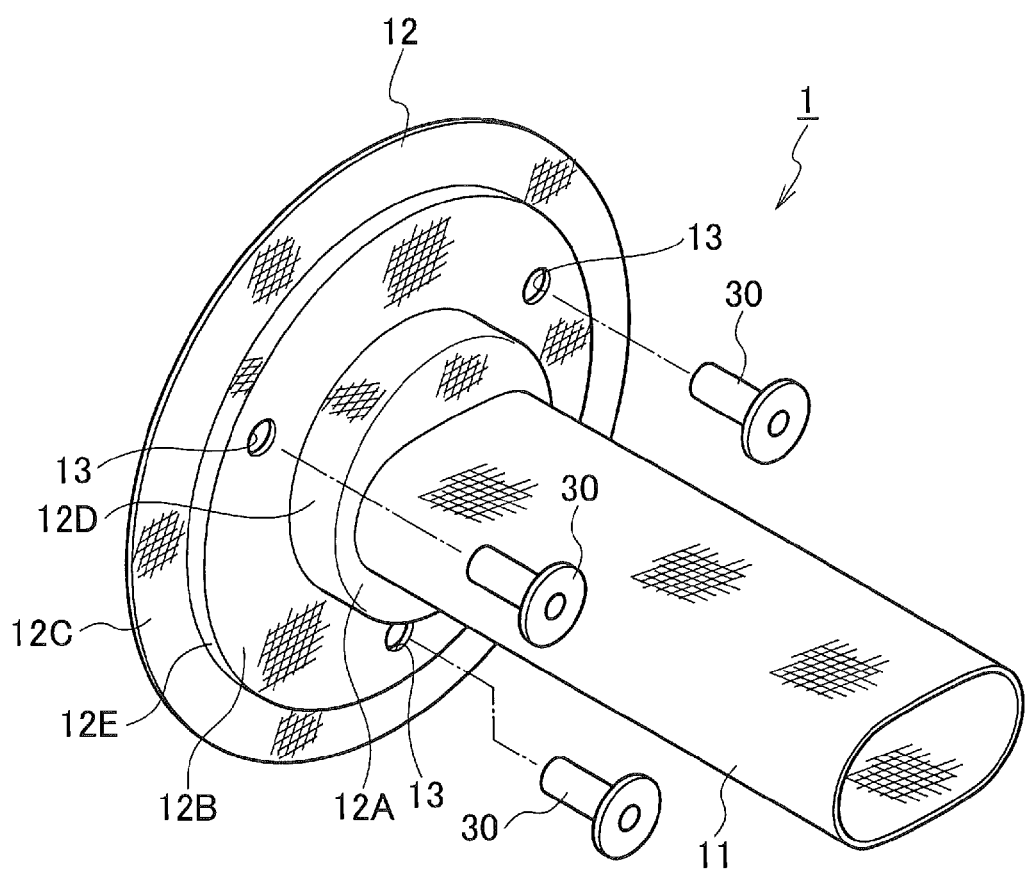
FIG. 2 is a perspective exploded view that illustrates the shield member according to the embodiment.

A shield member 1 according to the embodiment will be described with reference to FIGS. 1 and 2. Incidentally, the shield member 1 is used for a metal shield case to be mounted on an electric vehicle (EV), a hybrid electric vehicle (HEV) or the like.

The shield member 1 collectively surrounds a plurality of electrical wires (not illustrated) that is to be connected to a device (not illustrated) in a shield case (not illustrated), and is attached directly to the shield case. The shield member 1 is formed of cylindrical braided wires that are metal thin lines woven in mesh. The shield member 1 is provided at a shield-case-side terminal part of the main body part 11 integral with the main body part 11 along a longitudinal direction of the plurality of electrical wires (not illustrated), and includes a flange part 12 that faces a wall surface (not illustrated) of the shield case. The main body part 11 is formed of the braided wires to be flexible and cylindrical, and surrounds the electrical wires that are to be connected with the device in the shield case.

Stiffness of the flange part 12 is higher than stiffness of the main body part 11. The flange part 12 is formed by widening and folding back, into a plurality of layers, the terminal part of the main body part 11. The flange part 12 includes a plurality of surfaces having a stepped shape so that the surfaces which are along a substantially orthogonal direction of the main body part 11 and the surfaces which are along a substantially longitudinal direction of the main body part 11 are arranged alternately.

More specifically, the flange part 12 is configured to include a first surface 12A, a second surface 12B and a third surface 12C. Between the first surface 12A and the second surface 12B, a first step surface 12D is provided. Further, between the second surface 12B and the third surface 12C, a second step surface 12E is provided. In the second surface 12B, an insertion hole 13 in which a fixing member 30 such as a bolt and a blind rivet is to be inserted is formed. By the fixing member 30, the shield member 1 is fixed directly to the shield case (not illustrated).

Next, a method for manufacturing the shield member 1 will be described with reference to FIGS. 3A, 3B, and 4.

Figure 3A:
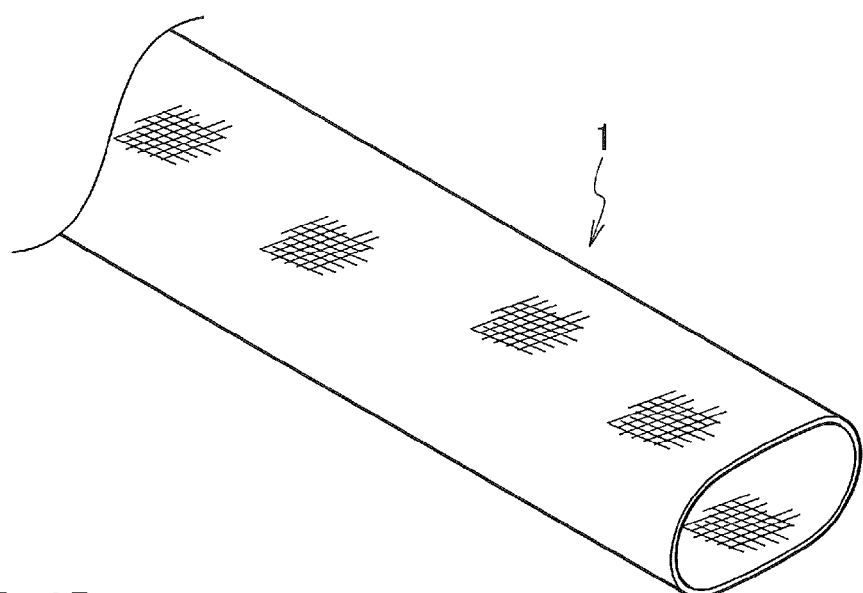
FIG. 3A is a view that illustrates a method for manufacturing the shield member according to the embodiment (Number one).
Figure 3B:
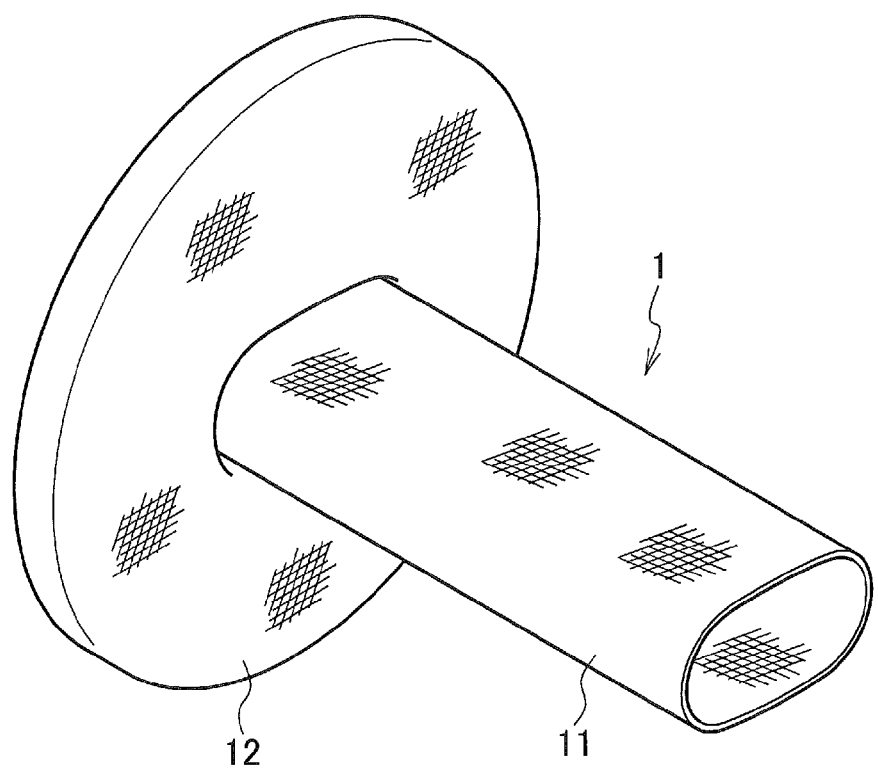
FIG. 3B is a view that illustrates a method for manufacturing the shield member according to the embodiment (Number two).

Firstly, a terminal (the terminal part of the main body part 11) of the shield member 1 shown in FIG. 3A, which is substantially cylindrical before the processing, is folded back into the plurality of layers and widened as shown in FIG. 3B. At this time, the terminal of the shield member 1 is preferably folded back into the plurality of layers without forming a gap to the mesh braided wires. Incidentally, the terminal of the shield member 1 may be widened and subsequently folded back into the plurality of layers.

Figure 4:
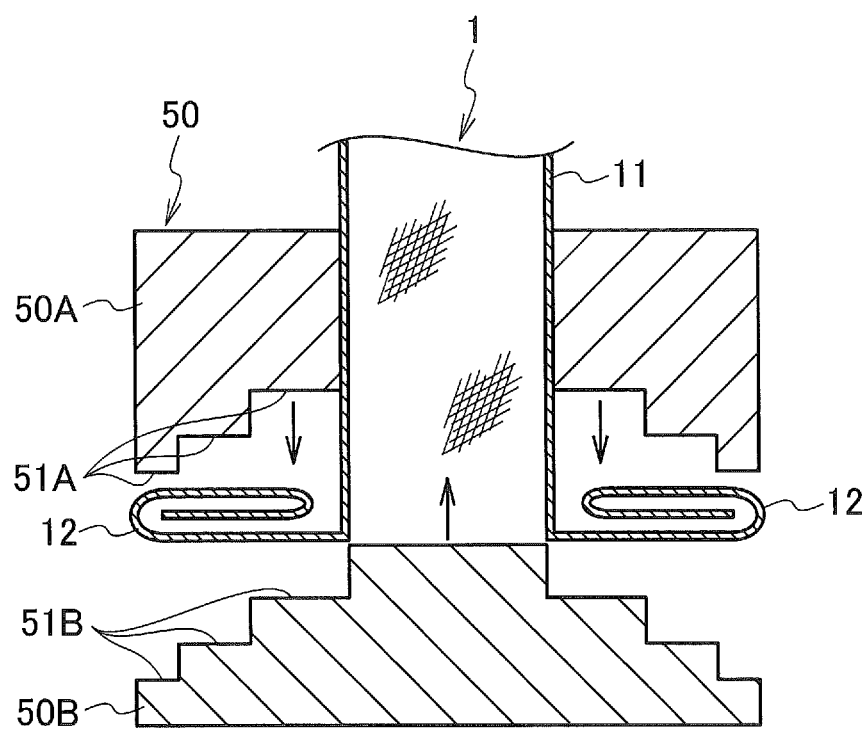
FIG. 4 is a view that illustrates a method for manufacturing the shield member according to the embodiment (Number three).
Figure 5:
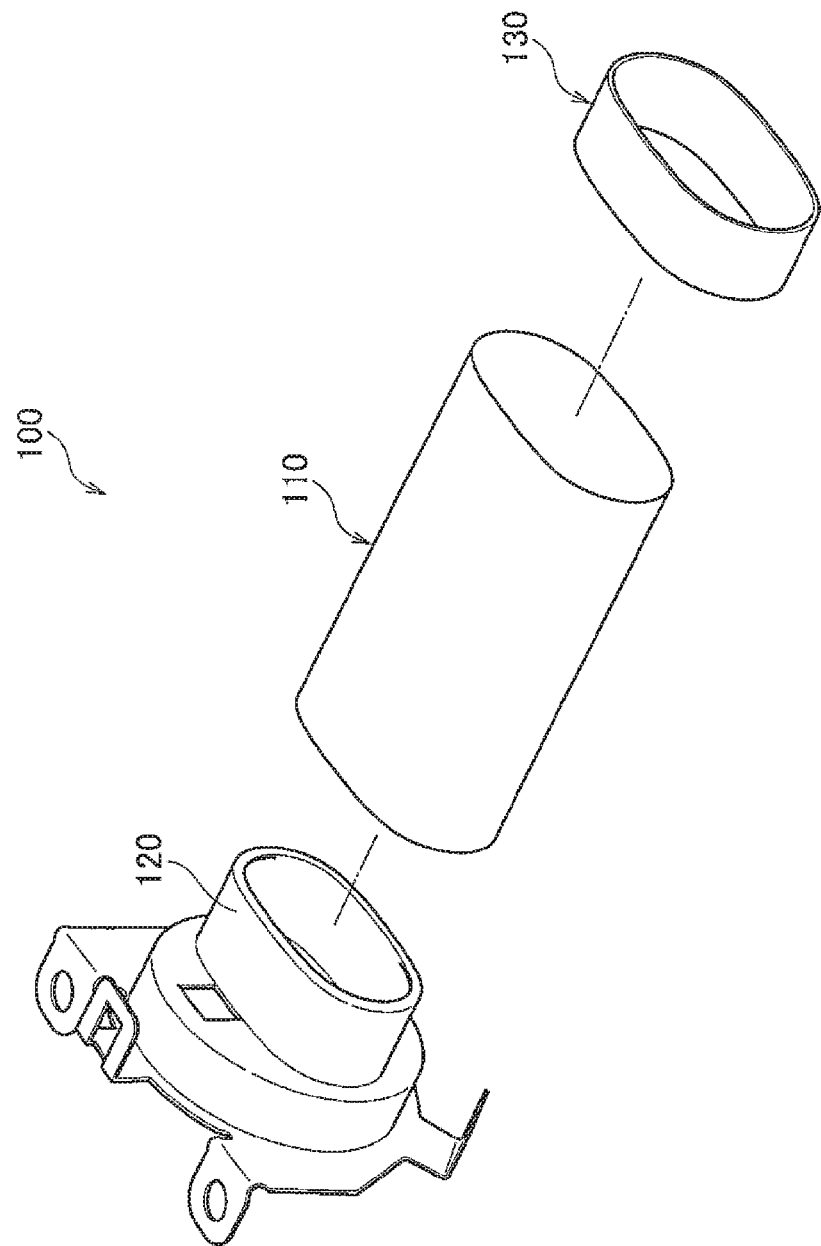
FIG. 5 is a perspective view that illustrates a shield structure according to a first conventional example.
Figure 6:
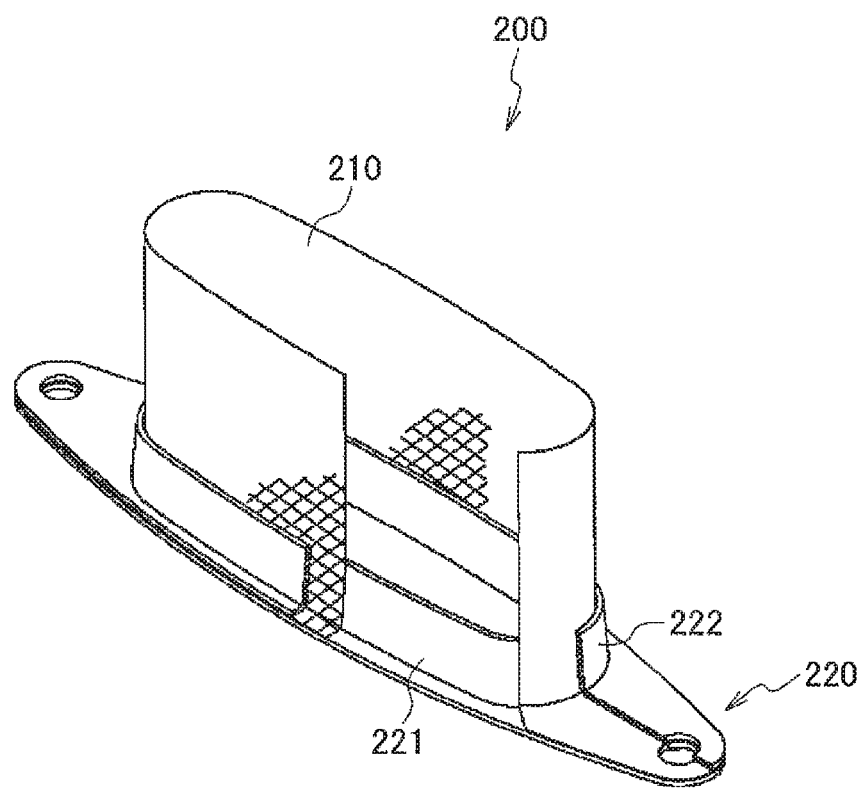
FIG. 6 is a cross-sectional view that illustrates a shield structure according to a second conventional example.

Subsequently, as shown in FIG. 4, the widened terminal of the shield member 1 is pressed by using a pressing machine 50 so as to be processed integrally with the flange part 12, thereby making the stiffness of the flange part 12 higher than the stiffness of the main body part 11 (the flange part 12 corresponds to the shield shells 110 and 210 in the conventional example). Here, the pressing machine 50 is provided with an upper die 50A and a lower die 50B. The upper die 50A and the lower die 50B are provided with step parts 51A and MB respectively for forming the first surface 12A, the second surface 12B, the third surface 12C, the first step surface 12D and the second step surface 12E of the flange part 12.

In the shield member 1 according to the embodiment, the flange part 12 is provided at the shield-case-side terminal part of the main body part 11 integral with the main body part 11, and the stiffness of the flange part 12 is higher than the stiffness of the main body part 11. Thereby, the shield member 1 does not require a process for attaching the flange part 12 as the shield shell to the terminal part of the main body part 11, so that the terminal part of the main body part 11 is not necessary to be processed. Consequently, unevenness of gaps of the mesh braided wires of the shield member 1 is not likely to be caused (the gaps become uniform), whereby the shieldability can be improved. Moreover, compared with the case where the shield members 110 and 210 and the shield shells 120 and 220 are individual, like in the conventional examples, the process for attaching the flange part 12 as the shield shell to the terminal part of the main body part 11 becomes unnecessary, and a shape of the flange part 12 can be maintained. Thus, only the direct attachment of the flange part 12 of the shield member 1 to the shield case (not illustrated) is necessary, so that the attachability to the shield case can be improved.

In particular, the shield member 1 according to the embodiment does not require pressing (crimping or sandwiching) the flange part 12 of the shield member 1 from its outer circumference, unlike the shield members of the conventional examples. Thus, unevenness of connection resistance of the flange part 12 of the shield member 1 can be suppressed, and the attachment of the shield member 1 to the shield case can be stable, whereby the shieldability can be improved.

Further, by forming the flange part 12 of the plurality of layers, the gaps of the respective mesh braided wires are not likely to be formed in the flange part 12.

In addition, only by shaping the flange part 12 to correspond to a shape of an attachment part of the shield case, the shieldability can be improved. Thereby, a connection part between the flange part 12 of the shield member 1 and the shield case is not necessary to be further covered with another shell member or the like, so that increase of the number of the members can be prevented.

In the shield member 1 according to the embodiment, the flange part 12 is formed by being pressed by the pressing machine 50. Thus, the unevenness of the gaps of the mesh braided wires of the flange part 12 is, of course, not likely to be caused, and the stiffness of the flange part 12 is increased, whereby the shape of the flange part 12 can be maintained.

As described above, the contents of the present invention has been disclosed by way of the embodiment, but the statement and the drawings forming a part of this disclosure should not be understood as limiting the present invention. From this disclosure, various substitute embodiments, examples and operation techniques shall be revealed for a person skilled in the art.

For example, the shield member 1 according to the embodiment can be modified as described below. More specifically, the shield member 1 has been explained to be used for the metal shield case to be mounted on an electric vehicle (EV), a hybrid electric vehicle (HEV) or the like, but the shield member 1 is not limited to this, and may be used for a purpose other than such vehicles.

Further, the shield member 1 has been explained to be formed of the braided wires, but the shield member 1 is not limited to this, and may be formed of a material having the shieldability, such as conductive members including metal foil and mesh tapes and conductive members in various shapes including spongy and thin-walled shapes.

Moreover, the flange part 12 has been explained to be formed by widening and folding back, into the plurality of layers, the terminal part of the main body part 11, but the flange part 12 is not limited to this, and the terminal part of the main body part 11 may not be folded back into the plurality of layers. For example, in the case where the shield member 1 has a spongy shape, the stiffness of the flange part 12 may be increased by being pressed by the pressing machine 50 to be higher than the stiffness of the main body part 11.

Furthermore, the shape of the flange part 12 is not necessarily limited to the shape that was described in the embodiment, and may correspond to the shape of the attachment part of the shield case or the like.

As described above, the present invention includes various embodiments and the like that are not described here, of course. Therefore, the technical scope of the present invention is determined only by the matters used to specify the invention according to the claim(s) which is appropriate from the above description.

What is claimed is:

1. A shield member comprising:
   a flexible main body part surrounding an electrical wire connected to a device in a shield case; and
   a flange part provided at a shield-case-side terminal part of the main body part so as to be integral with the main body part, facing a wall surface of the shield case, wherein the stiffness of the flange part is higher than the stiffness of the main body part, and
   the flange part is formed at the shield-case-side terminal part of the main body part by widening and folding back into a plurality of layers.

2. The shield member according to claim 1, wherein the flange part includes a plurality of surfaces having a stepped shape.

3. A method for manufacturing a shield member, the method comprising:
   forming a flange part integrally with a flexible main body part by widening and folding back the shield-case-side terminal part of the main body part into a plurality of layers, where the flange part is facing a wall surface of a shield case at a shield-case-side terminal part of the main body part and the main body part is surrounding an electrical wire connected to a device in the shield case, wherein
   the stiffness of the flange part is formed to be higher than the stiffness of the main body part.

* * * * *